(12) United States Patent
Stanford et al.

(10) Patent No.: US 6,211,685 B1
(45) Date of Patent: Apr. 3, 2001

(54) SURFACE PROBE FOR DETERMINING PHYSICAL PROPERTIES OF A SEMICONDUCTOR DEVICE

(75) Inventors: Joel R. Stanford, Austin, TX (US); Jeffrey Kersten, Tucson, AZ (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/141,399

(22) Filed: Aug. 27, 1998
(Under 37 CFR 1.47)

(51) Int. Cl.⁷ .................................................. G01R 31/02
(52) U.S. Cl. ............................................ 324/716; 324/762
(58) Field of Search .................... 324/716, 762, 324/722, 724, 719; 73/105; 250/306

(56) References Cited

U.S. PATENT DOCUMENTS

| | | | |
|---|---|---|---|
| 5,347,226 | * 9/1994 | Bachmann et al. | 324/724 |
| 5,475,318 | * 12/1995 | Marcus et al. | 324/762 |
| 5,507,179 | * 4/1996 | Gamble et al. | 73/105 |
| 5,929,438 | * 7/1999 | Suzuki et al. | 150/306 |
| 6,000,280 | * 12/1999 | Miller et al. | 73/105 |
| 6,045,115 | * 3/2000 | Takahashi et al. | 257/717 |

OTHER PUBLICATIONS

"Atomic Force Microscopy," available et at http://www.park.com/spmguide (9 pages). This reference was available prior to filing of the present patent application.

"Analysis of Diffused Profiles," in Campbell, S.A., *The Science and Engineering of Microelectric Fabrication*, cover page and pp. 52–59, Copyright © 1996 by Oxford Universtity Press.

"Measurement Techniques for Diffused (and ion implanted) Layers," in Wolf, S. et al., *Silicon Processing for the VLSI Era—vol. 1—Process Technology*, cover pageand pp. 267–276, Copyright © 1986 by Lattice Press.

"Electrical Properties of Metallic Thin Films" in Wolf, S. et al., *Silicon Processing for the VLSI Era—vol. 1—Process Technology*, cover pageand pp. 118–123, Copyright © 1986 by Lattice Press.

* cited by examiner

Primary Examiner—Safet Metjahic
Assistant Examiner—T. R. Sundaram

(57) ABSTRACT

A probe for determining a surface characteristic of an object includes a substrate, a plurality of cantilevers each having a distal end coupled to the substrate, and a plurality of probe tips each coupled to a proximal end of a respective one of the cantilevers for contacting a surface of the object. Such probes can be used to study properties of objects, such as layers of semiconductor devices. Electrical properties of the surface of the object, such as, for example, surface resistivity, can be determined using probes with conductive probe tips. Some probes include a substrate divided lengthwise into a first section and a second section with the first section being doped with an n-type material and the second section being doped with a p-type material. Other probes include conductive material disposed on the substrate and, optionally, on the cantilevers and/or probe tips to form individual conductive paths to the probe tips.

23 Claims, 6 Drawing Sheets

SURFACE PROBE FOR DETERMINING PHYSICAL PROPERTIES OF A SEMICONDUCTOR DEVICE

FIELD OF THE INVENTION

The present invention is, in general, directed to a probe for an atomic force microscope or similar instrument. More particularly, the present invention relates to a probe that can be used to measure the spreading resistance or resistivity of an object.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. Such silicon-based semiconductor devices often include metal-oxide-semiconductor (MOS) transistors, complimentary MOS (CMOS) transistors, bipolar transistors, bipolar CMOS (BiCMOS) transistors, etc.

Each of these semiconductor devices generally includes a semiconductor substrate on which a number of active devices are formed. The particular structure of a given active device can vary between device types. For example, in MOS transistors, an active device generally includes source and drain regions and a gate electrode which modulates current between the source and drain regions. In bipolar transistors, an active device generally includes a base, a collector, and an emitter.

Semiconductor devices, like the ones mentioned above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). This is accomplished by reducing the lateral and vertical dimensions of the device structure.

Often, it is desirable to study physical properties of the semiconductor device during or after construction of the device. One example is the surface structure of a layer of the semiconductor device. Surface features, deformities, and composition can be studied. Microscopy has been widely used to study surfaces. Optical microscopy has many uses in this regard, however, the resolution of optical microscopes is limited and, furthermore, differences in the device structure may not be readily apparent when viewed optically. Thus, other, more sensitive microscopy techniques, such as electron microscopy, scanning tunneling microscopy, and atomic force microscopy, are often used.

In addition to surface structures, other physical properties, including electrical properties, are also of interest. For example, the surface resistivity at points on a doped surface of a device may provide information about dopant type and concentration. A surface doping profile may be obtained by measuring the resistivity of the surface.

Typically, the surface resistivity is determined using spreading resistance measurements which are obtained by contacting the surface of the device with two contact leads and measuring the resistance to electrical current flowing through the semiconductor device between the two contact leads. Conventional devices used for measuring spreading resistance typically have contact leads with a diameter of 5 µm or more. This limits the spatial precision and resolution of the surface resistivity measurements and, therefore, the precision of the doping profile.

SUMMARY OF THE INVENTION

Generally, the present invention relates to a probe for use in determining the surface structure of a layer of a semiconductor device and/or measuring the surface resistivity of a layer of a semiconductor device. One embodiment of the invention is a probe for determining a surface characteristic of an object. The probe includes a substrate, a plurality of cantilevers each having a distal end coupled to the substrate, and a plurality of probe tips each coupled to a proximal end of a respective one of the cantilevers for contacting a surface of the object.

Another embodiment of the invention is a probe that includes a substrate divided lengthwise into a first section and a second section. The first section is doped with an n-type material and the second section is doped with a p-type material. A first cantilever is electrically coupled to the first section of the substrate and a first probe tip is electrically coupled to the cantilever and configured and arranged for contact with a surface. A second cantilever is electrically coupled to the second section of the substrate and a second probe tip is electrically coupled to the cantilever and configured and arranged for contact with a surface.

Yet another embodiment of the invention is a device for determining a characteristic of an object. The device includes a probe having a substrate, a plurality of cantilevers each having a distal end coupled to the substrate, and a plurality of probe tips each coupled to a proximal end of a respective one of the cantilevers for contacting a surface of the object. The device also includes a measurement apparatus configured and arranged to determine the characteristic of the object using the probe tips.

A further embodiment of the invention is a method of measuring a characteristic of an object that includes contacting a surface of the object with two probe tips each coupled to a substrate via a cantilever and determining the characteristic of the object using the probe tips.

Another embodiment of the invention is a method of determining a surface resistivity of a layer of a semiconductor device. The method includes contacting a surface of the object with two probe tips each coupled to a substrate via a cantilever. A resistance between two of the probe tips is measured and a surface resistivity is determined from the resistance.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
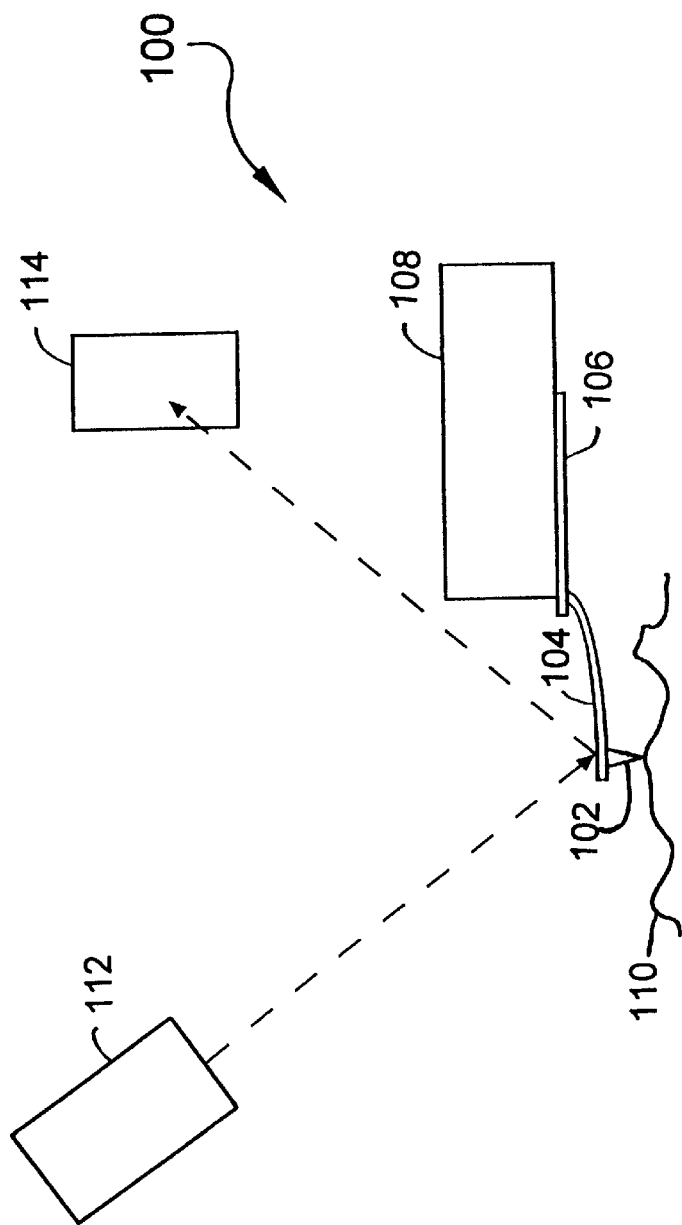
FIG. 1 is a schematic illustrating an exemplary atomic force microscope and its use.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to a number of semiconductor devices (such as MOS, CMOS, and BiCMOS devices, for example). In particular, the present invention is directed to a probe for use in determining the surface structure and/or surface resistivity (by, for example, determining the resistance between two or more points on the surface) of a layer of a semiconductor device. While the present invention may not be so limited, an appreciation of various aspects of the invention will be gained through a discussion of the probes in connection with the examples provided below. Moreover, although the design of a probe is illustrated in the context of use with an atomic force microscope, it will be understood that the probe may be configured for use with other devices, including other microscopes or devices designed for use with the probe.

Atomic force microscopy is one method used to study surface structure of semiconductor devices. One example of an atomic force microscope is illustrated in FIG. 1. For ease of illustration, the exemplary atomic force microscope 100 is not shown to scale. The atomic force microscope 100 includes a probe tip 102 attached to a cantilever 104 which is in turn attached to a probe substrate 106. The probe substrate 106 is coupled to a body 108 of the atomic force microscope 100. The body 108 may include, for example, components that move the probe tip 102 or perform other fictions in the operation of the atomic force microscope. Alternatively, the sample being studied, rather than the probe tip 102, may be moved.

The end of the probe tip 102 that contacts the surface 110 of the sample has a very small diameter. This diameter can be, for example, about 50 nm or less, and can often be 10 nm or less. Moreover, the diameter of the portion of the probe tip 102 that is actually in contact with the surface 110 is usually even smaller.

The surface 110 is typically a surface of a substrate or a layer of a semiconductor device. The substrate may be, for example, doped or undoped semiconductor material, such as silicon. The layer may be made using a dielectric, semiconductor, and/or conductive material. The atomic force microscope and surface probes of the invention can be used to study and determine properties of the substrate and other layers of the semiconductor device during or after fabrication.

In the contact mode of operation, the cantilever 104 applies sufficient force to keep the probe tip 102 in contact with the surface 110. The van der Waals interaction between the probe tip 102 and the surface 110 counteracts the force applied by the cantilever 104. Thus, the probe tip 102 makes light, but firm, contact with the surface 110.

The atomic force microscope 100 moves the probe tip 102 over a surface 110 (or the surface 110 is moved with the probe tip 102 remaining stationary) and the probe tip 102 moves up and down according to the contours of the surface 110. This causes the cantilever 104 to bend and unbend in response to the movement of the probe tip 102. This motion of the cantilever 104 is typically monitored to observe the surface features.

The motion of the cantilever 104 is often monitored by directing light from a light source 112 (typically, a laser) toward the cantilever 104. The position of the light reflected from the cantilever 104 varies in a generally predictable way with the bending and unbending of the cantilever 104 in response to the up and down movement of the probe tip 102 over the contours of the surface 110. Other useful detection methods include, for example, interferometry (e.g., interference patterns formed using light reflected from the cantilever 104), scanning electron microscopy, and piezoresistive detection (e.g., a resistance to the flow of current through the cantilever or substrate that varies with the amount of bending of the cantilever).

Atomic force microscopy may also be performed using non-contact modes of operation in which the probe tip 102 is vibrated near or in intermittent contact with the surface 110. The detector 114 in these modes of operation often measures changes in vibrational frequency and/or amplitude in response to the contours of the surface of the device 110.

Figure 2:
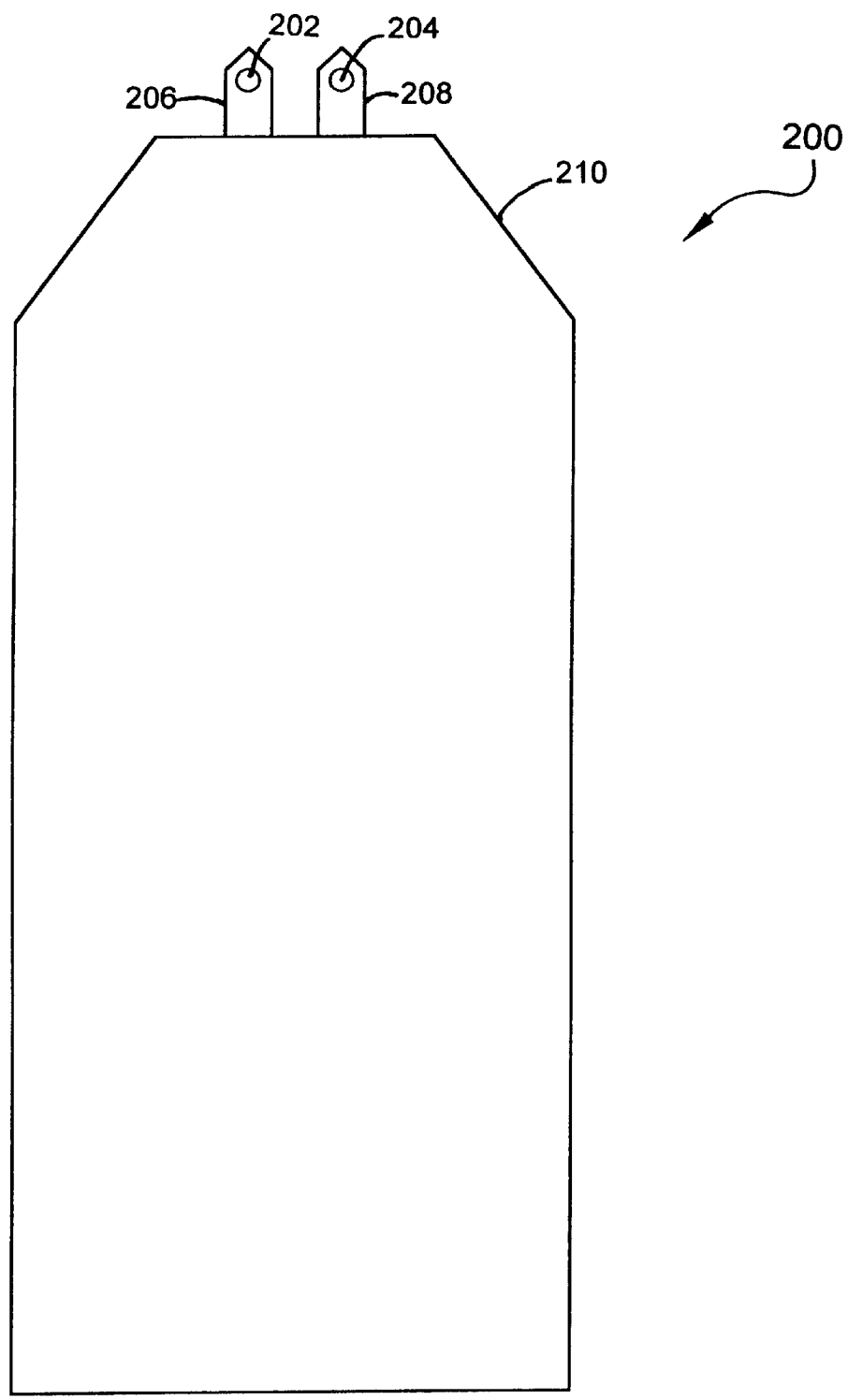
FIG. 2 is a bottom view of one embodiment of a surface probe, according to the invention.

A probe of the present invention includes multiple probe tips coupled to individual cantilevers. An exemplary probe 200 utilizing two probe tips is illustrated in FIG. 2. It will be understood, however, that probes of the present invention can also be formed using three or more probe tips. The exemplary probe 200 includes two probe tips 202 and 204. Each probe tip 202, 204 is coupled to a proximal end of a cantilever 206, 208. The distal ends of the cantilevers 206, 208 are, in turn, coupled to a proximal end of a substrate 210 to form the probe 200.

The probe tips 202, 204, cantilevers 206, 208, and substrate 210 are often formed using, for example, silicon or silicon nitride that can be patterned in the desired shapes. Other materials known to those of skill in the art may also be used.

The end of each probe tip 202, 204 that contacts the surface 110 (see FIG. 1) has a very small diameter. The small size of the probe tips 202, 204 permits the precise measurement of very small surface features. The diameter typically ranges from, for example, 20 nm or less, and, in some embodiments, 5 nm or less. Larger probe tips may also be used. The diameter of the contact surface (i.e., the footprint) of the probe tip 202, 204 is typically even smaller than the diameter of the probe tip 202, 204 itself.

The probe tips 202, 204 are coupled to individual cantilevers 206, 208. The cantilevers 206, 208 are made so that, when bent (at least to the extent expected during normal operation of the probe), the probe tip 202, 204 exerts a relatively constant force against a surface. As the probe tip 202, 204 moves across the surface, the cantilever 206, 208 bends and unbends according to the contours of the surface. Typical cantilevers for atomic force microscope probes have a length that ranges, for example, from 100 $\mu$m to 500 $\mu$m. Shorter and longer cantilevers may also be used.

The two cantilevers 206, 208 are typically placed in close proximity to each other to increase the spatial sensitivity of the probe. Typically, the two cantilevers 206, 208 are positioned to have a spacing of 150 $\mu$m or less between the probe tips 202, 204. Often this spacing is about 30 $\mu$m or less. Larger spacings may also be used.

The substrate 210 provides a platform for coupling the cantilevers 206, 208 to the remainder of the atomic force microscope or other measuring device. The length of the substrate 210 is, for example, typically 10 mm or less and is often 5 mm or less. Longer substrates may be used, depending, for example, on the particular atomic force microscope or other device used in conjunction with the probe 200.

A multi-tip probe may have a variety of uses. The multi-tip probe may permit faster scanning of a surface, as more than one region can be observed at any particular time. In addition, a second probe tip may be useful for monitoring the accuracy of data provided using the first probe tip. For example, the data from each probe tip can be compared to determine if the two measurements are within a tolerance limit. In addition, the slope of a surface 110 (see FIG. 1) may be determined by comparing measurements from two adjacent probe tips.

In addition, the contact between the probe tips 202, 204 and the surface, as facilitated by the cantilevers 206, 208, provides an adequate and reliable contact for electrical resistance measurements. Thus, surface resistivity can be determined if the probe tips are conducting or are covered with a conducting material. The probe tips can be used to determine surface resistivity and the surface resistivity can be used to determine information, such as, for example, dopant type, concentration, and profile. The contact surface of the probe tips of the present invention (having, for example, a diameter of 20 nm or less) is much less than conventional resistivity measurement devices that have probe tips with a diameter of 5 µm or more. Thus, the probes of the present invention can be used to obtain higher resolution information regarding surface resistivity.

Figure 3:
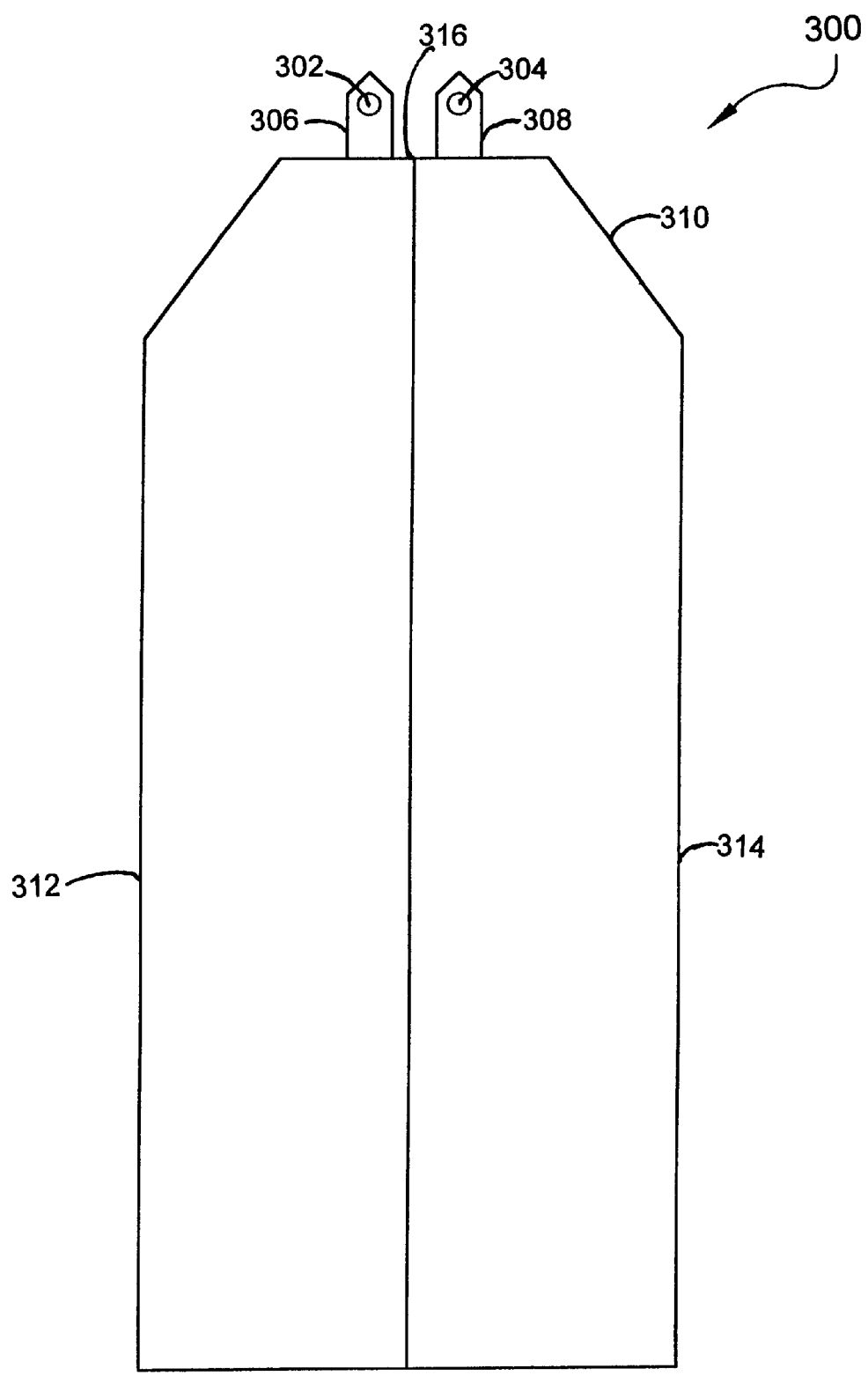
FIG. 3 is a bottom view of another embodiment of a surface probe, according to the invention.

One embodiment of a surface probe 300 for use in surface resistivity determinations is illustrated in FIG. 3. In this probe, the probe tips 302, 304, cantilevers 306, 308, and substrate 310 are doped to make these objects conductive. One probe tip 302, cantilever 306, and a first portion 312 of the substrate 310 are doped with a p-type dopant, such as, for example, boron or aluminum. The other probe tip 304, cantilever 308, and a second portion 314 of the substrate 310 are doped with an n-type dopant, such as, for example, nitrogen, phosphorus, or arsenic. The doping of the sections 312, 314 creates a p-n junction 316.

The substrate 310, cantilevers 306, 308, and probe tips 302, 304 of the probe 300 can be doped by a variety of techniques, including, for example, diffusional doping or ion implantation techniques. Selective doping of these portions of the probe 300 can be accomplished, for example, by photolithographic and/or masking techniques. The concentration of the dopant in each region 312, 314 ranges from, for example, $1 \times 10^{16}$ to $1 \times 10^{18}$ dopant atoms/cm$^2$. Other doping ranges may also be used.

The division of the substrate 310 into a first portion 312 and a second portion 314 may extend lengthwise across the substrate 310, as illustrated in FIG. 3. Other divisions of the substrate 310 may also be used. For example, portion 314 may be a small area of the substrate 310 to which cantilever 308 is attached.

In some embodiments, the surface area of the first and second portions 312, 314 is the same. In other embodiments, however, the size of the two portions 312, 314 is not the same. Typically, each section 312, 314 should have sufficient surface area to provide contact regions for providing contact with leads or the like of external electronics used to perform the surface resistivity determinations.

The determination of surface resistivity is accomplished by individually attaching a lead (not shown) or the like from external electronics (not shown) to each section 312, 314 of the substrate 310. The external electronics typically provides a constant and/or known current or potential and causes electricity to flow between the probe tips 302, 304 and through the layer of the semiconductor device. The constant and/or known current or potential generates a variable potential or current, respectively, that can be measured and used to determine the resistance of this electrical circuit, according to Ohm's law, $R_{cir}=E/I$.

In one embodiment, the resistance, $R_{semi}$, of the semiconductor device between the probe tips 302, 304 is assumed to be the resistance determined from the measurements using Ohm's law (i.e., $R_{semi} \approx R_{cir}$, this assumes that the resistance of the rest of the circuit is negligible). In another embodiment, the resistance, $R_{semi}$, of the semiconductor device between the probe tips 302, 304 is determined by subtracting a known or experimentally determined resistance, $R_{apparatus}$, of the external electronics, substrate, cantilevers, and/or probe tips (e.g., the measurement apparatus) from the resistance, $R_{cir}$, determined by the measurements (i.e., $R_{semi}=R_{cir}-$apparatus). The surface resistivity can then be determined using the resistance. For example, the surface resistivity, r, can be determined using the following equation:

$$r=R_{semi}A/1$$

where A is the area of contact between the probe tip and the surface of the semiconductor device and 1 is the distance between the probe tips. Other methods for determining surface resistivity may also be used.

Typically, the constant current or potential is applied so that the p-n junction 316, formed by the different doping materials of the sections 312, 314 of the substrate 310, is reverse-biased. This prevents conduction between the regions 312, 314 of the substrate 310 and, thereby, causes electrical conduction through the layer of the semiconductor device between the probe tips 302, 304.

Figure 4:
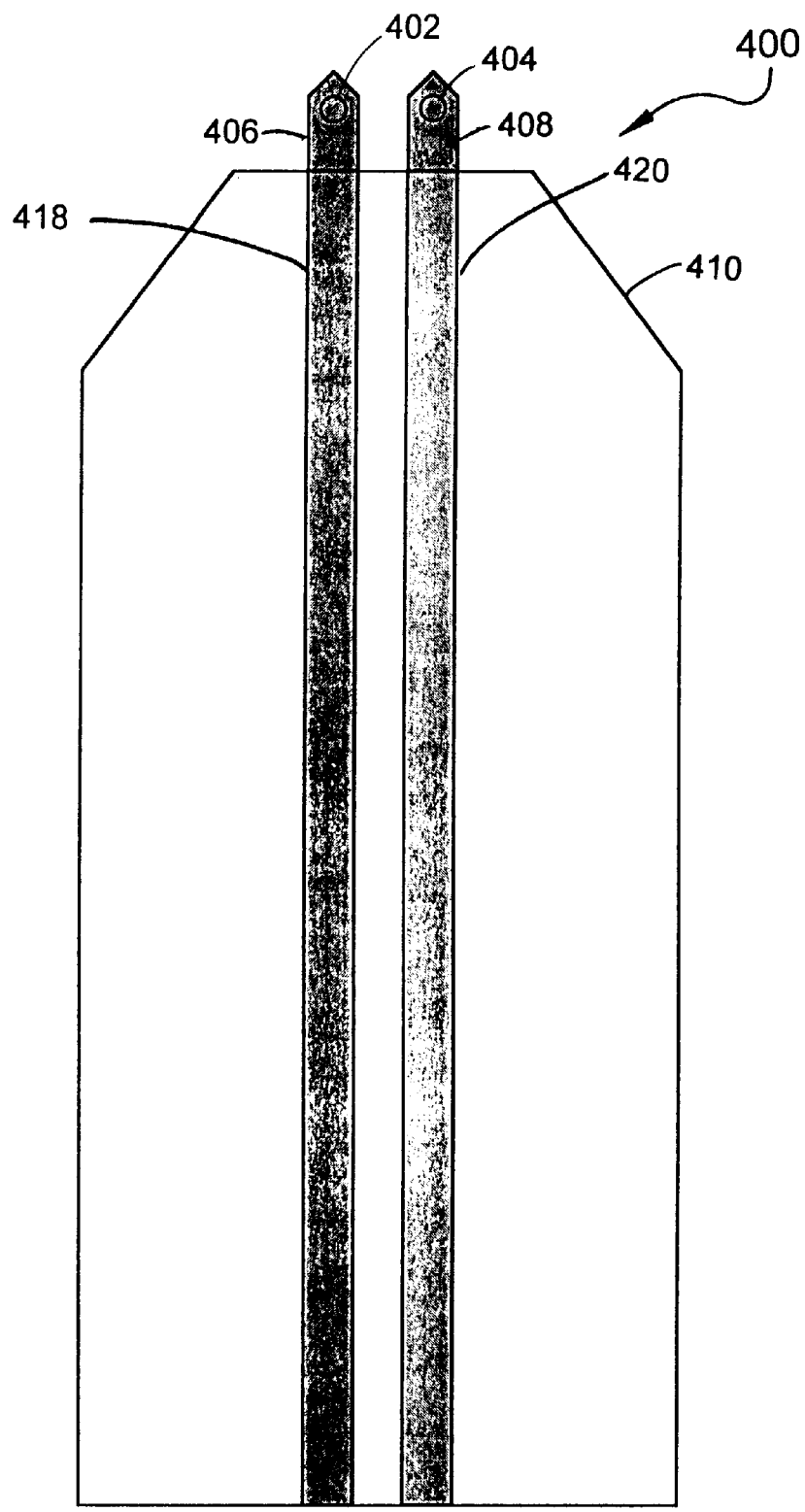
FIG. 4 is a bottom view of a third embodiment of a surface probe, according to the invention.

In another embodiment, a surface probe 400 has at least a portion of the probe tips 402, 404, cantilevers 406, 408, and/or substrate 410, covered with a conducting material 420, as illustrated in FIG. 4. The conducting material provides at least a portion of a path for carrying electrical current from the external electronics through the layer of the semiconductor device between the probe tips. Operation of the probe 400 for determining surface resistivity is essentially the same as the operation of the probe 300, as described above.

Suitable conducting materials includes metals, such as, for example, gold, chromium, silver, copper, titanium, and aluminum, and conductive compounds, such as, for example, titanium nitride and indium tin oxide. The conductive material may be formed on the substrate 410, cantilevers 406, 408, and/or probe tips 402, 404 by a variety of techniques, including, for example, chemical vapor deposition, physical vapor deposition, sputtering, coating, or plasma deposition. Individual paths of conductive material (e.g., conducting lines) may be formed, for example, by photolithography techniques.

In this embodiment, the substrate 410, probe tips 402, 404, and cantilevers 406, 408 are not doped. Continuous paths 418, 420 of conductive material are provided from the substrate 410 to each of the probe tips 402, 404. The material of the substrate acts as an insulator which separates the individual paths of conductive material. Typically, at least the portion of the probe tips 402, 404 that is configured for contact with the surface 110 (see FIG. 1) is covered with conductive material to provide uniform conduction through the semiconductor device.

Figure 5:
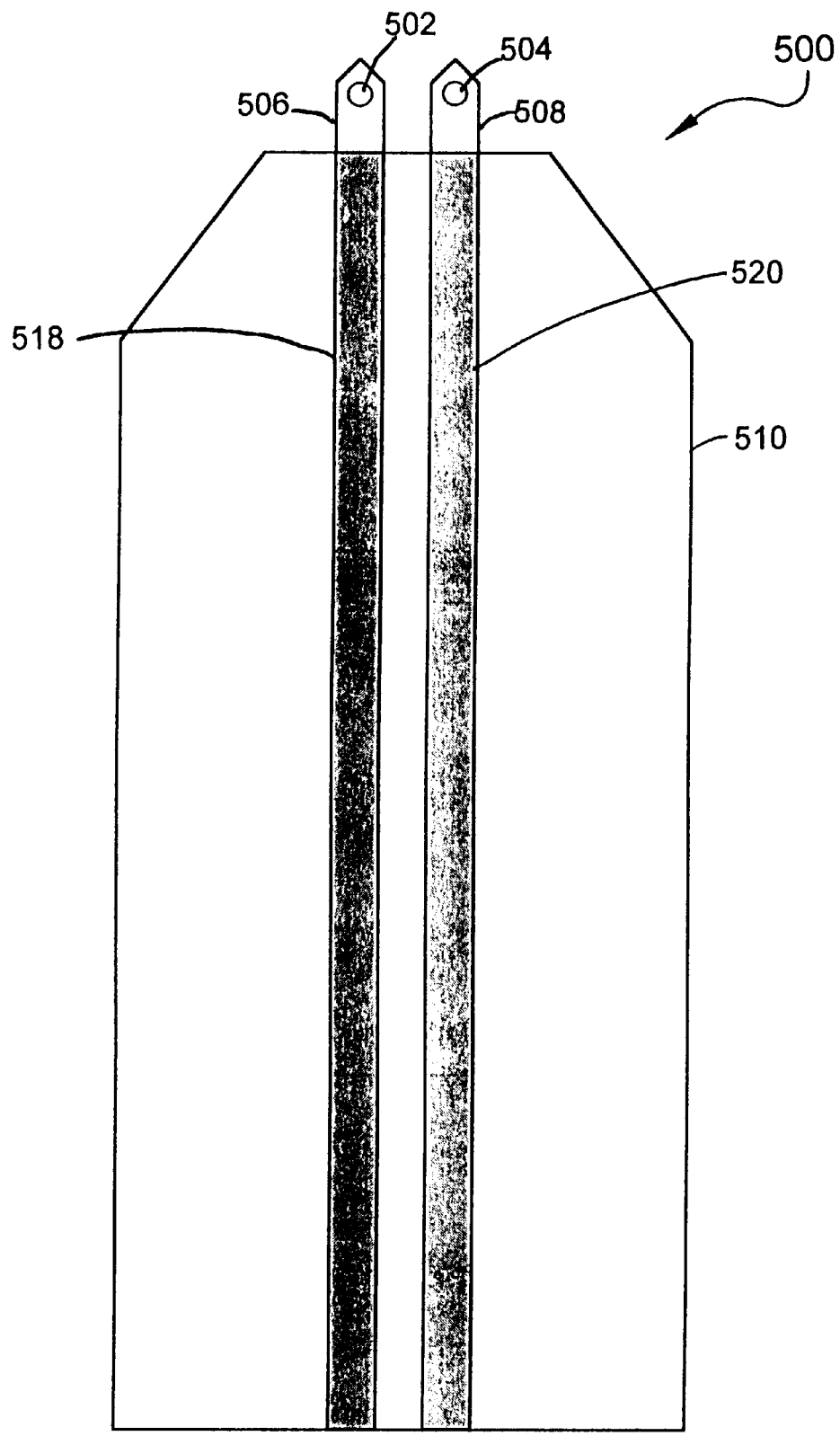
FIG. 5 is a bottom view of a fourth embodiment of a surface probe, according to the invention.

In another embodiment of a surface probe 500, a substrate 510 is not doped, but probe tips 502, 504 and, optionally, cantilevers 506, 508 are doped, as illustrated in FIG. 5. Conductive material is formed on the substrate 510 and, optionally, on the cantilevers 506, 508 to provide individual paths 518, 520 to the probe tips 502, 504. The conductive material may extend entirely, partially, or not at all along the cantilevers 506, 508 and the probe tips 502, 504. Accordingly, in operation, these embodiments of the surface probe of the invention may rely on the conductivity of the doped cantilevers and/or probe tips, if conductive material does not cover the cantilevers and/or probe tips.

Figure 6:
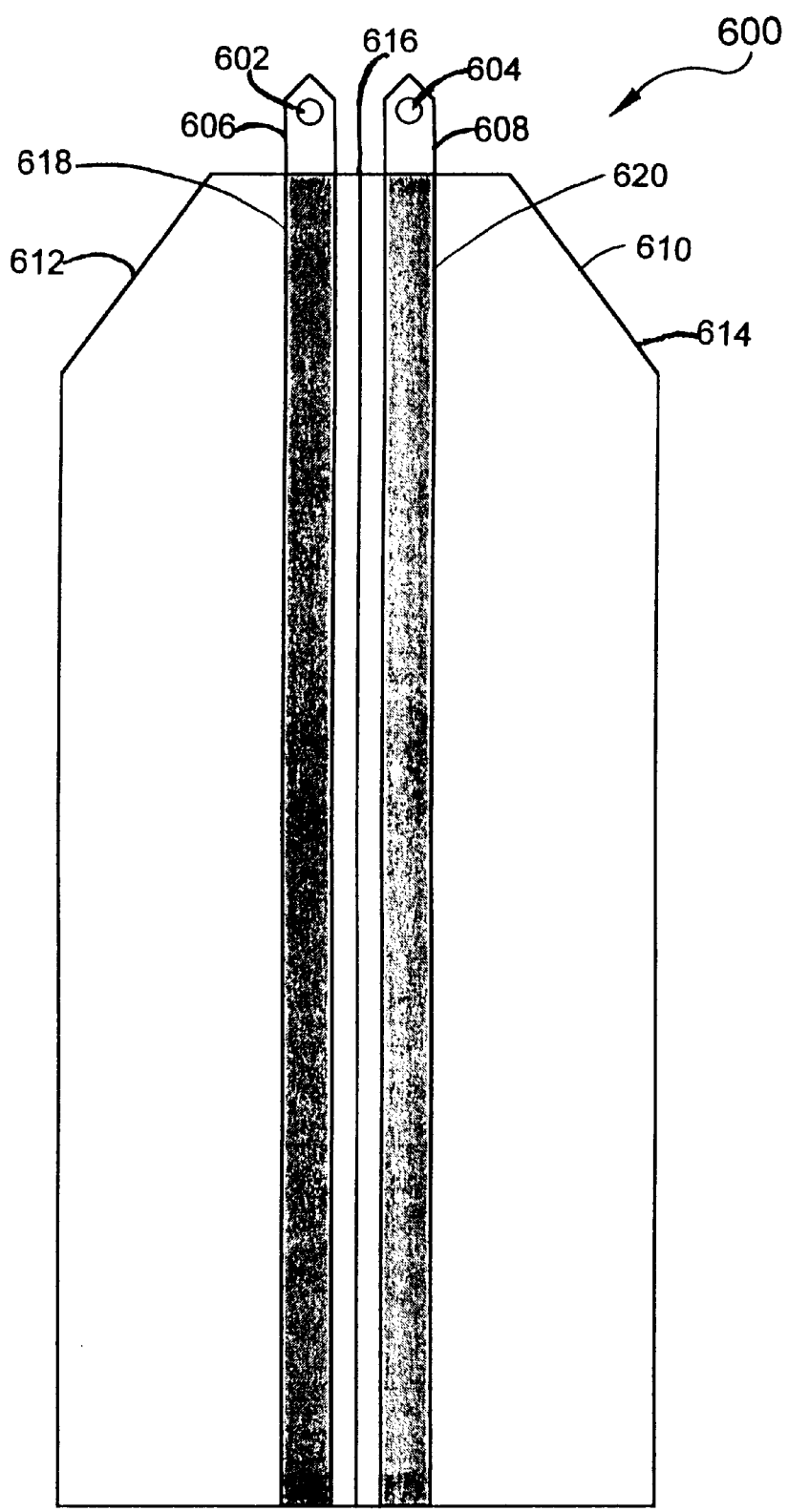
FIG. 6 is a bottom view of a fifth embodiment of a surface probe, according to the invention.

In yet another embodiment of a surface probe 600, one region 612 of the substrate 610, to which the probe tip 602 and cantilever 606 are coupled, is doped with a p-type material and another region 614 of the substrate 610, to which the probe tip 604 and cantilever 608, are coupled is doped with an n-type material, as shown in FIG. 6. The doping may be accomplished using, for example, the same materials and techniques as described above in connection with the probe 300 of FIG. 3. Optionally, the probe tip 502 and cantilever 506 are doped with p-type material and the probe tip 504 and cantilever 508 are doped with n-type material.

Conductive material is formed over the substrate 510, cantilevers 506, 508, and/or probe tips 502, 504 to provide individual paths 518, 520 to the probe tips 502, 504. The external electronics can then be coupled to the paths 518, 520 to provide a constant or known current or potential to measure the resistance, as described above. The constant or known current or potential is typically provided so that the p-n junction 516 between regions 512, 514 is reverse-biased, thereby preventing conduction across the p-n junction 516.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A probe for determining a surface characteristic of an object, comprising:
    a substrate having a first section and a second section, the first section being doped opposite the second section;
    a plurality of cantilevers including a first and a second cantilever respectively coupled to the first and second sections, and the first and second cantilevers each having a distal end coupled to the substrate; and
    a plurality of probe tips each coupled to a proximal end of a respective one of the cantilevers for contacting a surface of the object.

2. The probe of claim 1, wherein the substrate is divided into a first section and a second section, the first section being doped with a p-type material and the second section being doped with an n-type material.

3. The probe of claim 2, wherein the substrate is divided lengthwise between two of the cantilevers into the first section and the second section.

4. The probe of claim 2, wherein the first section and the second section have equal surface areas.

5. The probe of claim 1, wherein a portion of each probe tip, cantilever, and substrate is covered with a metal coating to form a conductive path from the substrate to each probe tip.

6. The probe of claim 1, wherein the substrate is divided into a first section with a first one of the cantilevers and a first one of the probe tips being coupled to the first section and a second section with a second one of the cantilevers and a second one of the probe tips coupled to the second section, the first section of the substrate, the first one of the cantilevers, and the first one of the probe tips being doped with a p-type material and the second section of the substrate, the second one of the cantilevers, and the second one of the probe tips being doped with an n-type material.

7. The probe of claim 1, wherein at least one of the substrate, the cantilevers, and the probe tips comprises at least one of silicon nitride and silicon.

8. The probe of claim 1, wherein each probe tip has an end configured and arranged for contacting the surface of the object, wherein the end of at least one probe tip has a diameter of 50 nm or less.

9. The probe of claim 1, wherein the end of at least one probe tip has a diameter of 10 nm or less.

10. The probe of claim 1, wherein the probe is configured and arranged for use in an atomic force microscope.

11. The probe of claim 1, wherein the distance between at least two of the probe tips is 150 μm or less.

12. A probe comprising:
    a substrate divided lengthwise into a first section and a second section, the first section being doped with an n-type material, the second section being doped with a p-type material;
    a first cantilever electrically coupled to the first section of the substrate;
    a first probe tip electrically coupled to the first cantilever and configured and arranged for contact with a surface;
    a second cantilever electrically coupled to the second section of the substrate; and
    a second probe tip electrically coupled to the second cantilever and configured and arranged for contact with a surface.

13. The probe of claim 12, wherein the first probe tip and the second probe tip are separated by 150 μm or less.

14. The probe of claim 12, wherein the first cantilever and the first probe tip are doped with an n-type material and the second cantilever and the second probe tip are doped with a p-type material.

15. A device for determining a characteristic of an object, the device comprising:
    a probe including
        a substrate having a first section and a second section, the first section being doped with a p-type material and the second section being doped with an n-type material,
        a plurality of cantilevers each having a distal end coupled to the substrate, and
        a plurality of probe tips each coupled to a proximal end of a respective one of the cantilevers for contacting a surface of the object; and
    a measurement apparatus configured and arranged to determine the characteristic of the object using the probe tips.

16. The device of claim 15, wherein the characteristic is a contour of a surface.

17. The device of claim 16, wherein the measurement apparatus comprises a light source directed toward at least one of the cantilevers and a position-sensitive detector that receives light reflected from the cantilever to determine a position of the cantilever.

18. The device of claim 15, wherein the characteristic is a resistance of the object between two of the probe tips in contact with the object.

19. The device of claim 15, wherein the substrate is divided into a first section and a second section, the first section being doped with a p-type material and the second section being doped with an n-type material.

20. A method of measuring a characteristic of an object, comprising:

contacting a surface of the object with two probe tips each coupled to a substrate via a cantilever; and determining the characteristic of the object using the probe tips.

21. The method of claim 20, wherein the characteristic comprises a contour of the surface of the object and determining the characteristic comprises measuring a deflection of at least one cantilever as a probe tip coupled to the cantilever moves over the surface of the object.

22. The method of claim 20, wherein the characteristic comprises a surface resistivity of a surface region of the object and determining the characteristic comprises measuring a resistance between the two probe tips in contact with the surface region of the object.

23. A method of determining a surface resistivity of a layer of a semiconductor device, comprising:

contacting a surface of the semiconductor device with two probe tips coupled to a substrate via a cantilever;

measuring a resistance between two of the probe tips; and determining a surface resistivity from the resistance.

* * * * *

UNITED STATES PATENT AND TRADEMARK OFFICE
CERTIFICATE OF CORRECTION

PATENT NO. : 6,211,685 B1
DATED : April 3, 2001
INVENTOR(S) : Stanford et al.

It is certified that error appears in the above-identified patent and that said Letters Patent is hereby corrected as shown below:

Column 6,
Line 23, "$R_{semi}=R_{cir}$-apparatus" should read -- $R_{semi}=R_{cir}-R_{apparatus}$ --.

Signed and Sealed this

Twentieth Day of August, 2002

Attest:

JAMES E. ROGAN
Attesting Officer  Director of the United States Patent and Trademark Office